(12) United States Patent
Tajima et al.

(10) Patent No.: US 9,837,980 B2
(45) Date of Patent: Dec. 5, 2017

(54) ACOUSTIC WAVE DEVICE AND METHOD OF FABRICATING THE SAME

(71) Applicant: TAIYO YUDEN CO., LTD., Tokyo (JP)

(72) Inventors: Motoyuki Tajima, Kanagawa (JP); Kaoru Sakinada, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 701 days.

(21) Appl. No.: 14/227,663

(22) Filed: Mar. 27, 2014

(65) Prior Publication Data

US 2014/0339957 A1    Nov. 20, 2014

(30) Foreign Application Priority Data

May 14, 2013  (JP) .................................. 2013-102520

(51) Int. Cl.
*H03H 9/10* (2006.01)
*H03H 9/05* (2006.01)

(52) U.S. Cl.
CPC .......... *H03H 9/1092* (2013.01); *H03H 9/105* (2013.01); *H01L 2224/11* (2013.01); *H01L 2224/16225* (2013.01); *H01L 2924/19105* (2013.01); *H03H 9/059* (2013.01); *H03H 9/0514* (2013.01); *Y10T 29/49204* (2015.01)

(58) Field of Classification Search
CPC ............................. H03H 9/1092; H03H 9/105
USPC ............................. 310/313 R, 313 B, 313 D
See application file for complete search history.

(56) References Cited

U.S. PATENT DOCUMENTS

| 8,154,170 | B2* | 4/2012 | Kimura ................. H03H 9/059 310/313 R |
| 8,436,514 | B2* | 5/2013 | Fukano ................. H03H 9/059 310/313 R |
| 8,810,111 | B2* | 8/2014 | Fukano .............. H03H 9/02897 310/344 |
| 2004/0232802 | A1 | 11/2004 | Koshido |
| 2005/0067681 | A1 | 3/2005 | De Villeneuve et al. |
| 2010/0225202 | A1* | 9/2010 | Fukano ................. H03H 9/059 310/313 C |

FOREIGN PATENT DOCUMENTS

| JP | 2002-009577 A | 1/2002 |
| JP | 2004-129223 A | 4/2004 |
| JP | 2004-208236 A | 7/2004 |

(Continued)

OTHER PUBLICATIONS

Japanese Office Action dated May 23, 2017, in a counterpart Japanese patent application No. 2013-102520.

*Primary Examiner* — Thomas Dougherty
*Assistant Examiner* — Karen B Addison
(74) *Attorney, Agent, or Firm* — Chen Yoshimura LLP

(57) ABSTRACT

An acoustic wave device includes: a substrate; a pad formed on the substrate; a cap formed of an inorganic insulating material and located on the substrate, the cap including a cavity located in a surface of the cap at a substrate side and a penetration hole formed in a location overlapping with the pad; a terminal filling the penetration hole, coupled to the pad on the substrate, and formed of solder; and a functional element formed on an upper surface of the substrate and in the cavity, the functional element exciting an acoustic wave.

12 Claims, 15 Drawing Sheets

(56) References Cited

FOREIGN PATENT DOCUMENTS

| | | | |
|---|---|---|---|
| JP | 2006-128930 A | 5/2006 | |
| JP | 2006-217226 A | 8/2006 | |
| JP | 2007-96597 A | 4/2007 | |
| JP | 2007-158989 A | 6/2007 | |
| JP | 2007-516602 A | 6/2007 | |
| JP | 2008-60382 A | 3/2008 | |
| JP | 2008-153957 * | 7/2008 | ............... H03H 9/25 |
| JP | 2012-119928 A | 6/2012 | |
| WO | 2005/031861 A1 | 4/2005 | |

* cited by examiner

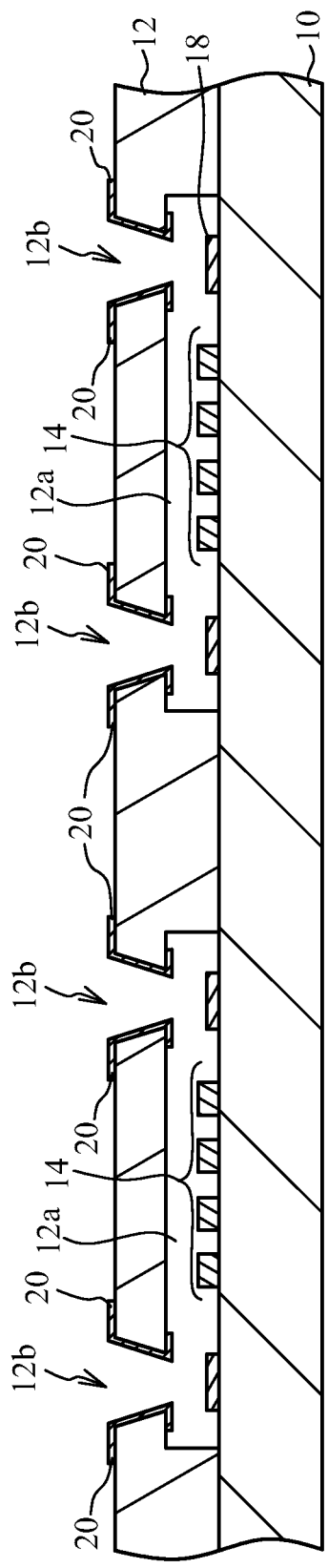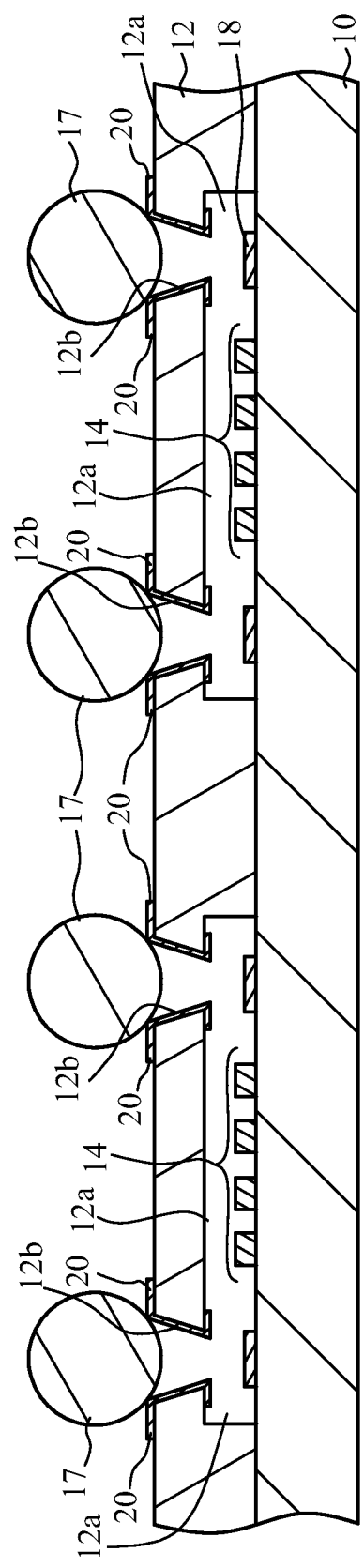

US 9,837,980 B2

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2013-102520, filed on May 14, 2013, the entire contents of which are incorporated herein by reference.

FIELD

A certain aspect of the present invention relates to an acoustic wave device and a method of fabricating the same.

BACKGROUND

As filters and duplexers mounted to communication devices such as mobile phones, used are acoustic wave devices such as surface acoustic wave (SAW) devices and Film Bulk Acoustic Resonators (FBAR). In the acoustic wave devices, a functional element excites an acoustic wave. The functional element in the SAW device is an IDT (Interdigital Transducer) on a piezoelectric substrate while the functional element in the FBAR is a region in which an upper electrode, a piezoelectric thin film, and a lower electrode overlap with each other.

It is important to secure an air-space around the functional element and protect the functional element from moisture and impurities to maintain characteristics of the acoustic wave device good. Japanese Patent Application Publication No. 2006-217226 discloses an invention that seals an IDT with a sealing portion formed of a resin.

However, moisture sometimes penetrates through the resin and enters a space in which the functional element is sealed. Moisture erodes an electrode included in the functional element. In addition, the moisture entering the air-space vaporizes by heating. Increase in volume due to the vaporization increases stress, and causes a crack in the resin. The crack reduces sealing performance and makes the protection of the functional element difficult.

SUMMARY OF THE INVENTION

According to an aspect of the present invention, there is provided an acoustic wave device including: a substrate; a pad formed on the substrate; a cap formed of an inorganic insulating material and located on the substrate, the cap including a cavity located in a surface of the cap at a substrate side and a penetration hole formed in a location overlapping with the pad; a terminal fills the penetration hole, coupled to the pad on the substrate, and formed of solder; and a functional element formed on an upper surface of the substrate and in the cavity, the functional element exciting an acoustic wave.

According to another aspect of the present invention, there is provided a method of fabricating an acoustic wave device including: providing a functional element exciting an acoustic wave on an upper surface of a substrate; providing a pad on the upper surface of the substrate; forming a cavity in a first surface of a cap; forming a penetration hole in the cap, the penetration hole penetrating from the upper surface of the cap to the cavity; providing the cap on the upper surface of the substrate so that the penetration hole overlaps with the pad and the functional element is located in the cavity; and providing a terminal by filling up the penetration hole with solder.

BRIEF DESCRIPTION OF THE DRAWINGS

FIG. 4A and FIG. 4B are cross-sectional views illustrating a step after the substrate is bonded to the cap in the method of fabricating the acoustic wave device;

DETAILED DESCRIPTION

A description will now be given of embodiments with reference to the drawings.

First Embodiment

Figure 1A:
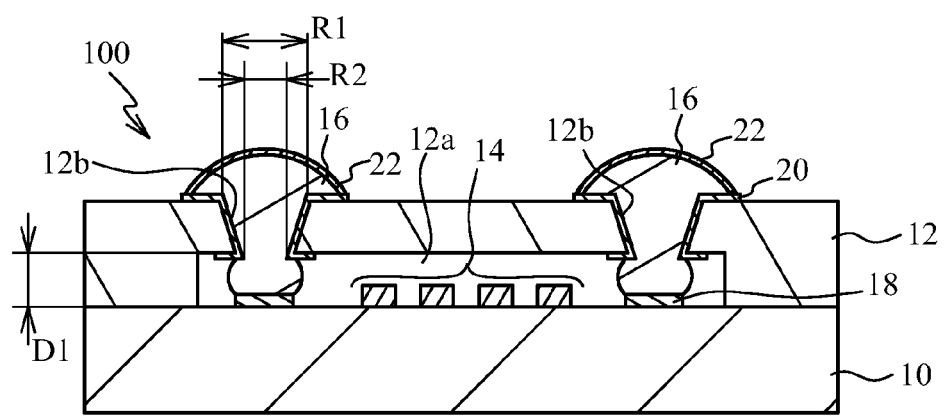
FIG. 1A is a cross-sectional view illustrating an acoustic wave device in accordance with a first embodiment.
Figure 1B:
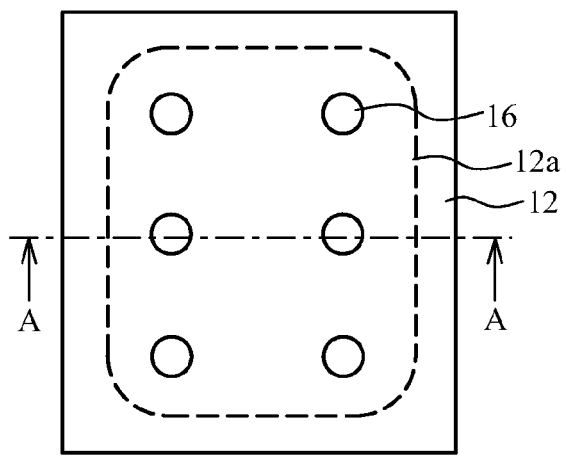
FIG. 1B is a plan view illustrating the acoustic wave device.

A first embodiment is an exemplary SAW device including a cap 12 made of an inorganic insulating film. FIG. 1A is a cross-sectional view illustrating an acoustic wave device in accordance with the first embodiment. FIG. 1B is a plan view illustrating the acoustic wave device, and indicates an inner wall of a cavity 12a with a dashed line. FIG. 1A illustrates a cross-section taken along line A-A in FIG. 1B.

As illustrated in FIG. 1A, an acoustic wave device 100 is a SAW device such as a SAW resonator or a SAW filter, and includes a substrate 10, the cap 12, an IDT 14, and terminals 16. The cap 12, the IDT 14, and pads 18 are located on the upper surface of the substrate 10. The cap 12 is bonded to the substrate 10 by room-temperature bonding. For example, the cap 12 is bonded to the substrate 10 by making the boundary face between them in an amorphous state, or with an adhesive material. The cavity 12a is formed in a surface, which opposes the substrate 10, of the cap 12. The IDT 14 and the pads 18 are sealed in the cavity 12a by the cap 12 and the terminals 16. The cavity 12a has a depth D1 of, for example, 5 μm. As illustrated in FIG. 1A and FIG. 1B, the cap 12 covers the substrate 10 and completely surrounds the IDT 14.

As illustrated in FIG. 1A, penetration holes 12b penetrating through the cap 12 in the thickness direction and connecting to the cavity 12a are formed in the cap 12 in the locations overlapping with the pads 18. The penetration hole 12b tapers from the upper surface of the cap 12 toward the cavity 12a. The penetration hole 12b has a diameter R1 of, for example, 150 μm at the upper surface side of the cap 12, and has a diameter R2 of, for example, 80 μm at the lower surface side. A metal layer 20 is continuously formed from the region surrounding the penetration hole 12b on the upper surface of the cap 12 to the region surrounding the penetration hole 12b on the lower surface of the cap 12 through the inner wall of the penetration hole 12b.

The terminal 16 is electrically connected to the pad 18, and is located away from the IDT 14. The terminal 16 is extracted from the inside of the cavity 12a to the outside of the upper surface of the cap 12 through the penetration hole 12b. In addition, the terminal 16 is bonded to the metal layer 20 and fills the penetration hole 12b. A plated layer 22 is located on the surface of the terminal 16. As illustrated in FIG. 1B, six terminals 16 are exposed from the upper surface of the cap to the outside of the acoustic wave device 100. The terminal 16 acts as an external terminal connecting the acoustic wave device 100 to the outside.

The application of voltage to the IDT 14 through the terminal 16 makes the IDT 14 excite an acoustic wave. The IDT 14 is exposed to the cavity 12a, and thus the excitation of the acoustic wave by the IDT 14 is not interrupted. Reflectors reflecting the acoustic wave toward the IDT 14 may be located at both sides of the IDT 14.

The substrate 10 is a piezoelectric substrate having a thickness of, for example, 180 μm and formed of a piezoelectric substance such as lithium tantalate ($LiTaO_3$) or lithium niobate ($LiNbO_3$). The cap 12 is formed of a piezoelectric substance such as $LiTaO_3$ or $LiNbO_3$. The IDT 14 is sealed by the cap 12 made of a piezoelectric substance, and thus is sealed more hermetically than by a resin. Hermetic sealing suppresses the penetration of moisture and foreign matters, and therefore corrosion of the IDT 14 and production of cracks are suppressed. Both the substrate 10 and the cap 12 are made of a piezoelectric substance, and thus the substrate 10 and the cap 12 have thermal expansion coefficients close to each other. Therefore, stress generated at the time of temperature change can be reduced. Especially, the stress is greatly reduced when both the substrate 10 and the cap 12 are formed of the same material.

As described later, melted solder wet-spreads over the pad 18. To make the area over which the solder wet-spreads large to enhance the bond strength, the pad 18 preferably has a certain thickness. The pad 18 is formed by stacking, for example, nickel (Ni) with a thickness of 3 μm and gold (Au) with a thickness of 0.04 μm in this order from the substrate 10 side. The terminal 16 is formed of solder composed mostly of, for example, tin and silver (Sn—Ag). The metal layer 20 is formed of a metal such as Au. The surfaces of the pad 18 and the metal layer 20 are preferably made of a material such as Au having good solder wettability. This makes the terminal 16 easily wet-spread over the pad 18 and the metal layer 20 and allows the stable electrical connection between the terminal 16 and the pad 18. In addition, the terminal 16 fills the penetration hole 12b, and thereby the cavity 12a is hermetically sealed and the hermeticity is enhanced. The plated layer 22 is made of a metal such as copper (Cu). The plated layer 22 covers the terminal 16, and thereby, the solder of the terminal 16 is prevented from flowing out when the acoustic wave device 100 is mounted on an external substrate. The IDT 14 is formed of a metal such as aluminum (Al).

Figure 2A:
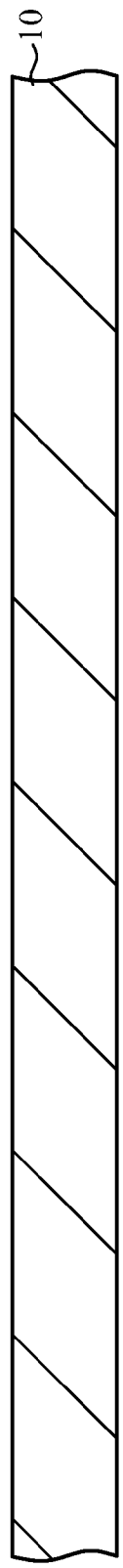
FIG. 2A through FIG. 2C are cross-sectional views illustrating a step of processing a substrate in a method of fabricating the acoustic wave device.
Figure 2B:
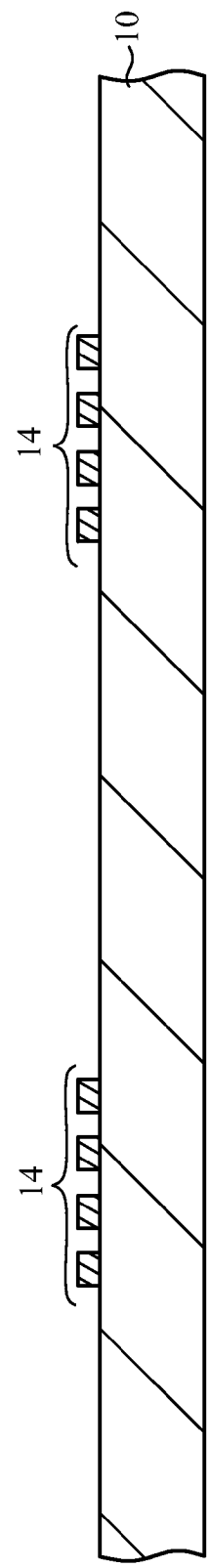
Figure 2C:
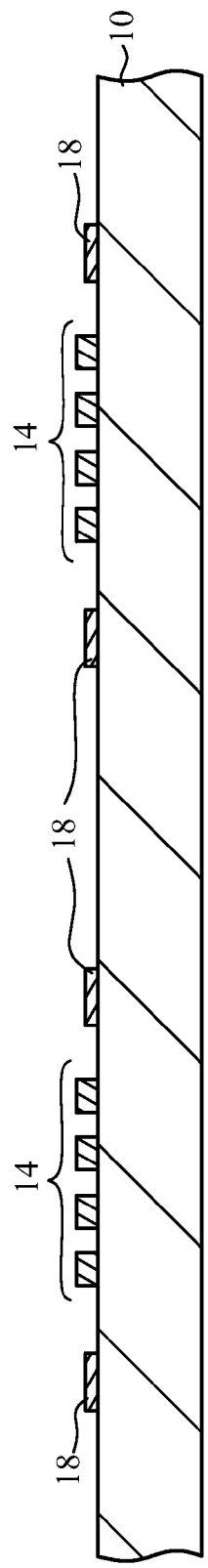

A description will now be given of a method of fabricating the acoustic wave device 100. FIG. 2A through FIG. 2C are cross-sectional views illustrating a step of processing the substrate 10 in the method of fabricating the acoustic wave device 100. FIG. 3A through FIG. 3D are cross-sectional views illustrating a step of processing the cap 12 in the method of fabricating the acoustic wave device 100. FIG. 4A through FIG. 5B are cross-sectional views illustrating a step after the substrate 10 is bonded to the cap 12 in the method of fabricating the acoustic wave device 100.

As illustrated in FIG. 2A, the substrate 10 in a wafer state is prepared. As illustrated in FIG. 2B, the IDTs 14 are formed on the upper surface of the substrate 10 by, for example, evaporation and liftoff. As illustrated in FIG. 2C, the pads 18 are formed on the upper surface of the substrate 10 by, for example, evaporation and liftoff. The surface of the substrate 10 to be bonded to the cap 12 is mirrored.

Figure 3A:
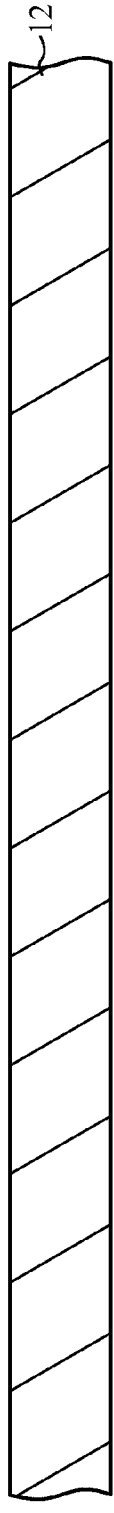
FIG. 3A through FIG. 3D are cross-sectional views illustrating a step of processing a cap in the method of fabricating the acoustic wave device.
Figure 3B:
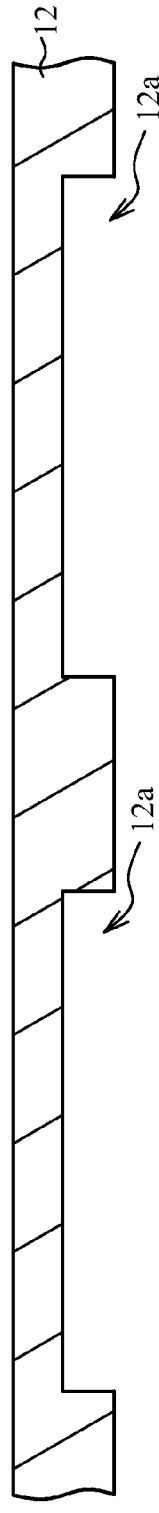
Figure 3C:
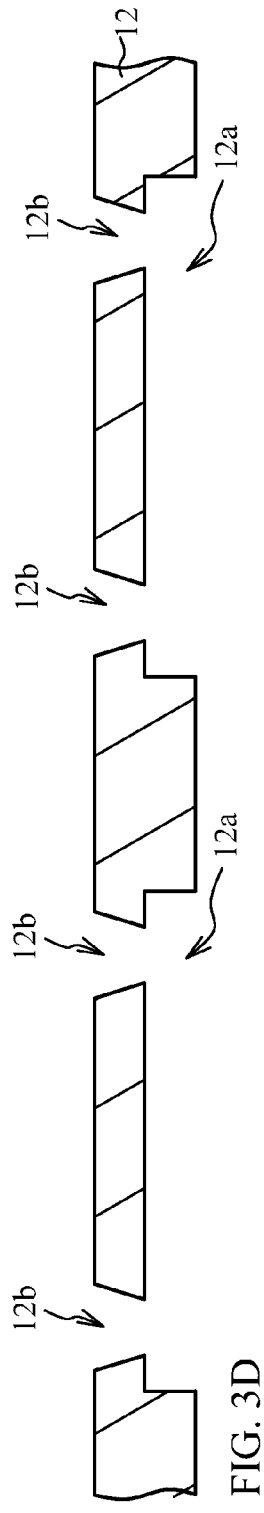
Figure 3D:
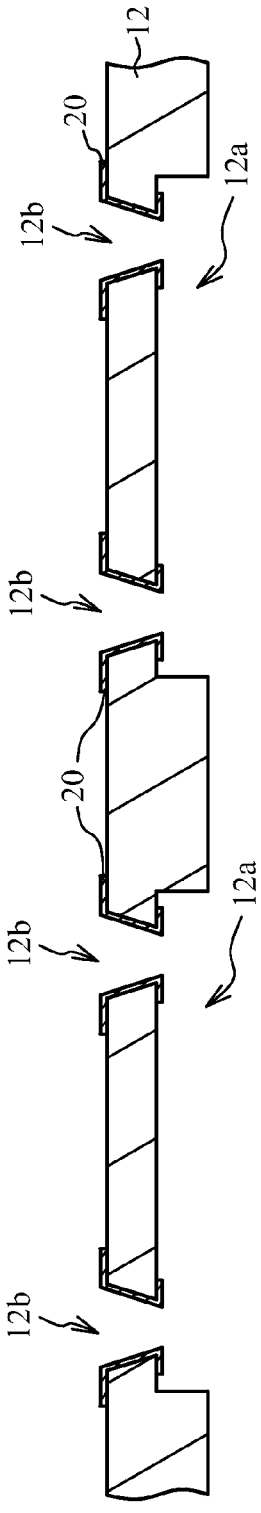

As illustrated in FIG. 3A, the cap 12 in a wafer state is prepared. As illustrated in FIG. 3B, the cavities 12a are formed in the lower surface of the cap 12 by, for example, sandblasting, a laser beam, or etching. The surface of the cap 12 to be bonded to the substrate 10 is mirrored. As illustrated in FIG. 3C, formed by a laser beam or sandblasting are the penetration holes 12b with a tapered shape penetrating from the upper surface of the cap 12 to the cavities 12a. As illustrated in FIG. 3D, the metal layers 20 are formed by, for example, plating.

Figure 5A:
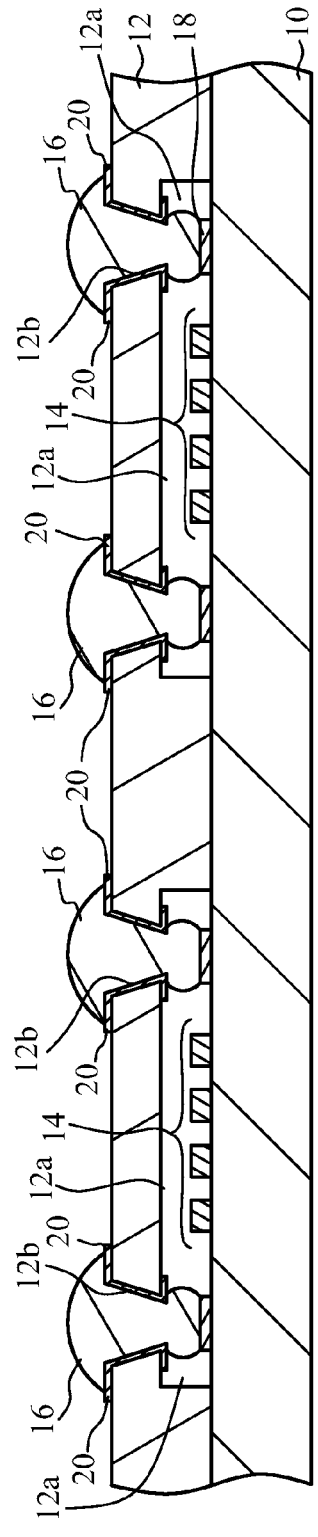
FIG. 5A and FIG. 5B are cross-sectional views illustrating the step after the substrate is bonded to the cap in the method of fabricating the acoustic wave device.
Figure 5B:
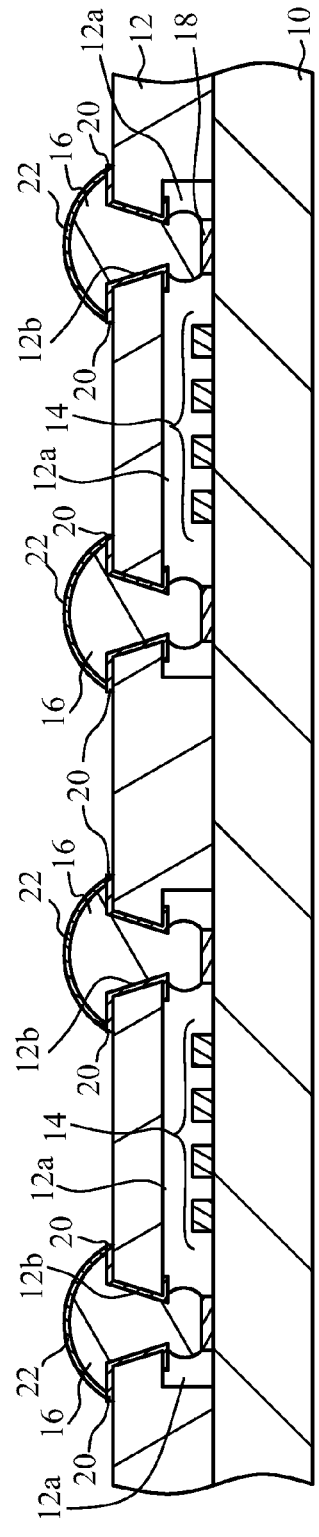

As illustrated in FIG. 4A, the cap 12 is bonded to the upper surface of the substrate 10 by room-temperature bonding so that the cavity 12a overlaps with the IDT 14 and the penetration hole 12b overlaps with the pad 18. Solder balls 17 are located as illustrated in FIG. 4B, and then the terminals 16 are formed by melting the solder balls 17 as illustrated in FIG. 5A. Then, the plated layers 22 covering the terminals 16 are formed as illustrated in FIG. 5B. A detailed description will be given of forming of the terminal 16 with reference to enlarged views.

Figure 6A:
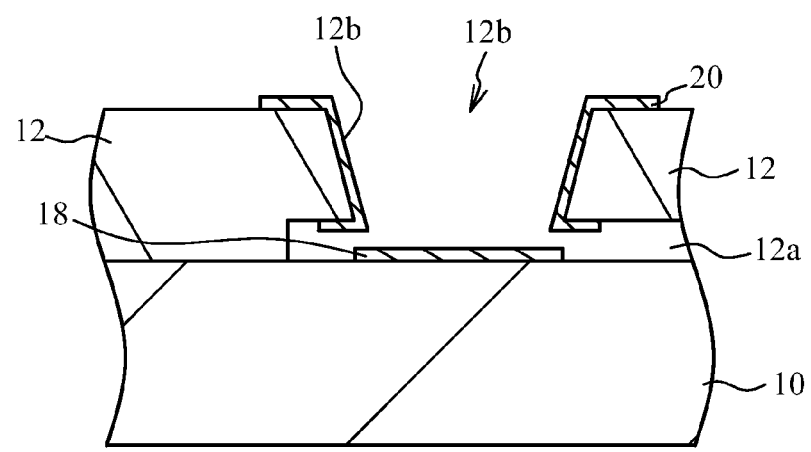
FIG. 6A and FIG. 6B are enlarged cross-sectional views around a penetration hole.
Figure 6B:
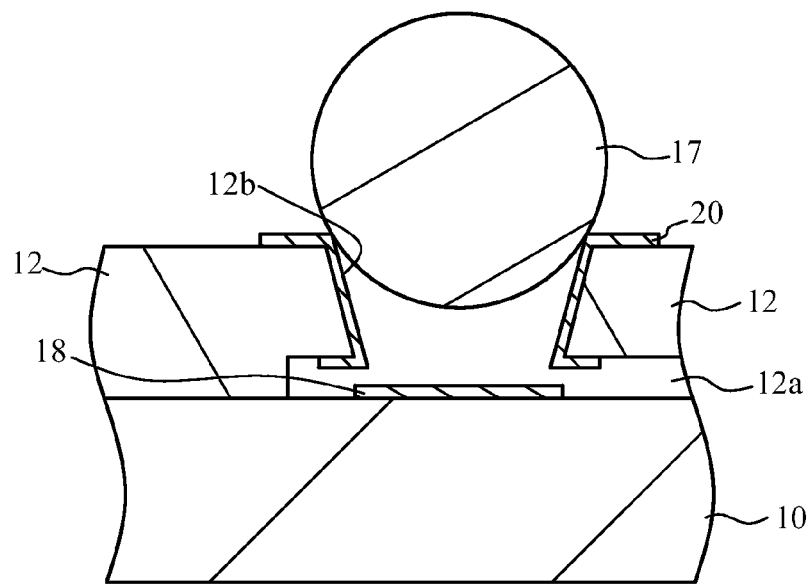
Figure 7A:
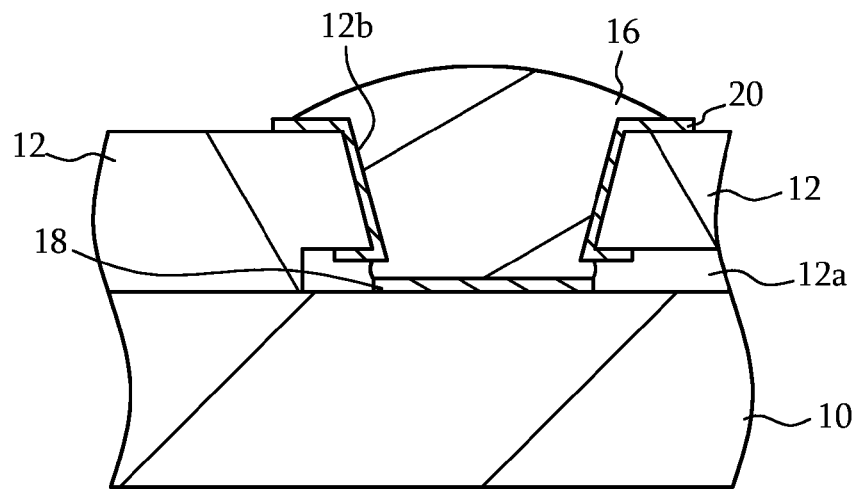
FIG. 7A and FIG. 7B are enlarged cross-sectional views around the penetration hole.
Figure 7B:
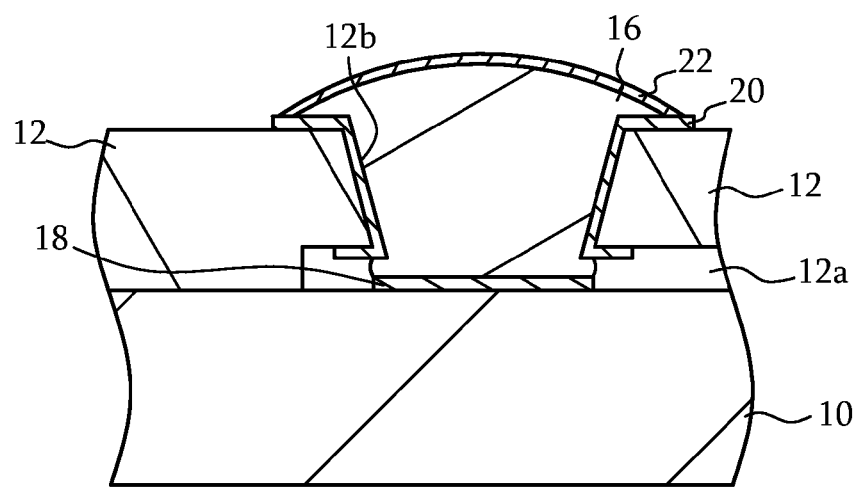

FIG. 6A through FIG. 7B are enlarged cross-sectional views around the penetration hole 12b. As illustrated in FIG. 4A and FIG. 6A, the metal layer 20 is formed from the upper surface of the cap 12 to the lower surface side of the cap 12 through the inner wall of the penetration hole 12b. As illustrated in FIG. 4B and FIG. 6B, the solder ball 17 is located on the penetration hole 12b. The diameter of the solder ball 17 is greater than the diameter of the penetration hole 12b at the upper surface side of the cap 12, and thereby, the solder ball 17 does not fall from the penetration hole 12b and remains on the cap 12. As illustrated in FIG. 5A and FIG. 7A, the solder ball 17 is melted by, for example, reflow or irradiation of a laser beam. The melted solder ball 17 wet-spreads over the metal layer 20, penetrates into the cavity 12a through the penetration hole 12b, and wet-spreads over the pad 18. This process forms the terminal 16. As illustrated in FIG. 5B and FIG. 7B, the plated layer 22 covering the surface of the terminal 16 is formed by, for example, plating.

The melted solder wet-spreads from the metal layer 20 to the pad 18, and thus the electrical connection between the solder and the pad 18 is secured. The metal layer 20 is not formed in the location overlapping with the IDT 14 in the thickness direction, and thus the solder is prevented from spreading toward the IDT 14, and a short circuit hardly occurs. The penetration hole 12b has a tapered shape, and this makes the melted solder easily flow toward the pad 18 through the penetration hole 12b. The connection between the terminal 16 and the pad 18 is secured. In addition, the terminal 16 closes the penetration hole 12b and thereby, the IDT 14 is hermetically sealed.

Figure 8:
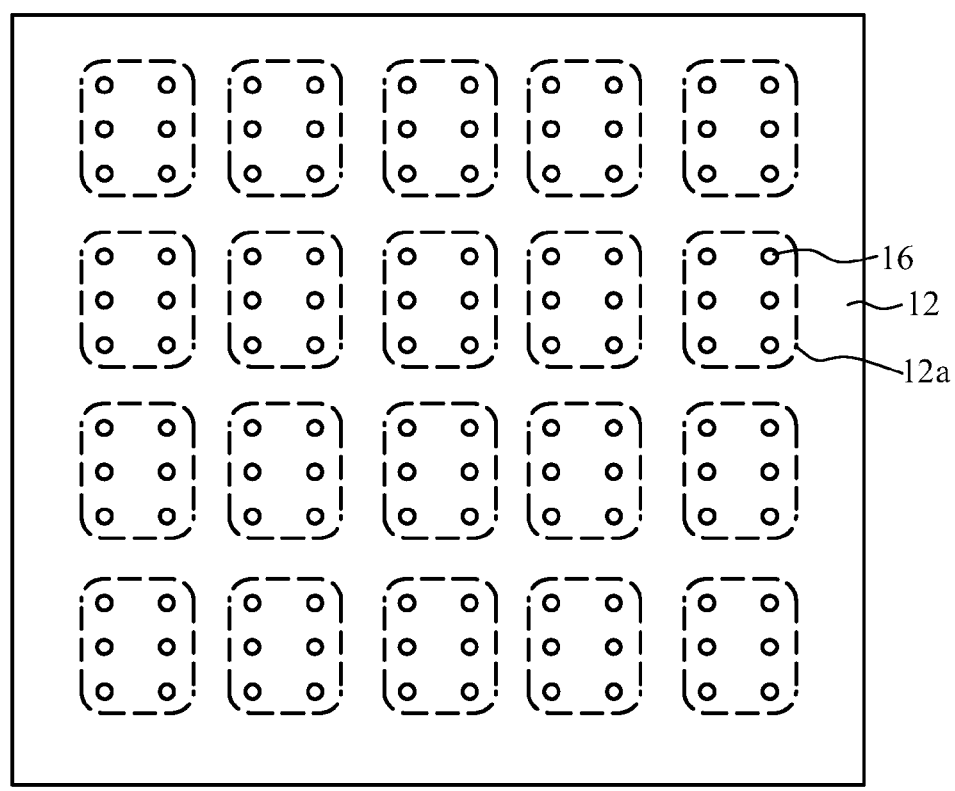
FIG. 8 is a plan view illustrating the acoustic wave devices in a wafer state.

FIG. 8 is a plan view illustrating the acoustic wave devices 100 in a wafer state. The steps illustrated in FIG. 3A through FIG. 7B bond the substrate 10 in a wafer state to the cap 12 in a wafer state as illustrated FIG. 8, and the terminals 16 are exposed from the cap 12. The substrate 10 and the cap 12 are separated into individual acoustic wave devices 100 by dicing.

The cap 12 may be formed of sapphire. Sapphire has a thermal conductivity greater than that of a resin, and thus the heat release performance of the acoustic wave device 100 is improved. Sapphire has a small thermal expansion coefficient and a large Young's modulus. Thus, the expansion of the substrate 10 is suppressed. When the cap 12 is formed of a piezoelectric substance or an inorganic insulating material such as sapphire, the hermeticity is enhanced, and the temperature characteristics of the acoustic wave device 100 is improved.

Figure 9:
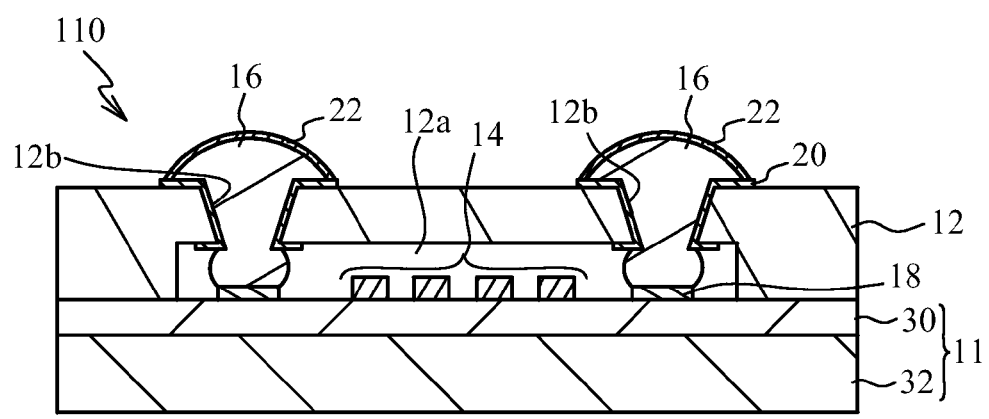
FIG. 9 is a cross-sectional view illustrating an acoustic wave device in accordance with a variation of the first embodiment.

A description will now be given of a variation of the first embodiment. FIG. 9 is a cross-sectional view illustrating an acoustic wave device 110 in accordance with the variation of the first embodiment. As illustrated in FIG. 9, a substrate 11 is formed from a piezoelectric substrate 30 and a sapphire substrate 32 bonded to the lower surface of the piezoelectric substrate 30. The piezoelectric substrate 30 has a thickness of 20 µm while the sapphire substrate 32 has a thickness of 130 µm. The cap 12 is formed of sapphire. The cap 12 and the sapphire substrate 32 have high thermal conductivities, and thus the acoustic wave device 110 has a high heat release performance. The substrate 11 includes the sapphire substrate 32, and the cap 12 is formed of sapphire. Therefore the substrate 11 has a thermal expansion coefficient close to that of the cap 12. Therefore, the stress generated at the time of temperature change is reduced.

Second Embodiment

Figure 10:
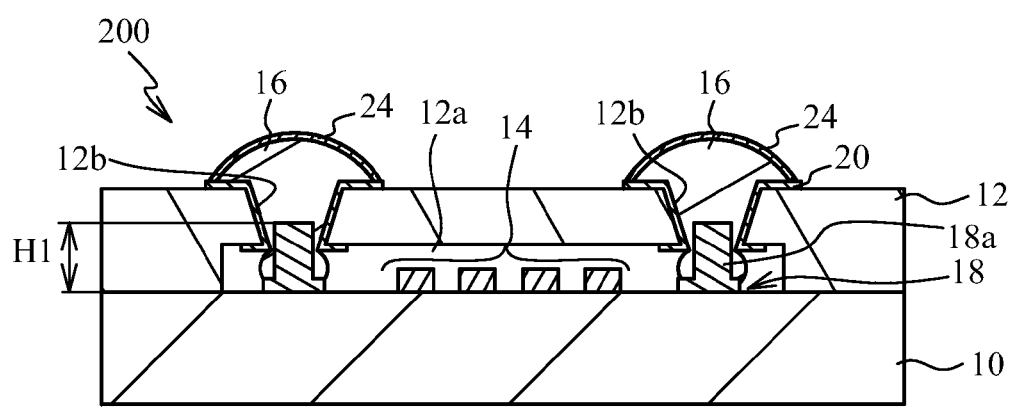
FIG. 10 is a cross-sectional view illustrating an acoustic wave device in accordance with a second embodiment.

A second embodiment describes a case where the pad 18 is a columnar pad. FIG. 10 is a cross-sectional view illustrating an acoustic wave device 200 in accordance with the second embodiment.

As illustrated in FIG. 10, the pad 18 includes a protrusion 18a that protrudes upward from the upper surface of the substrate 10. The protrusion 18a has a height H1 of, for example, 10 µm. The upper surface of the protrusion 18a is located upper than the lower surface of the cap 12, and reaches the inside of the penetration hole 12b. The terminal 16 wet-spreads over the protrusion 18a, the pad 18, and the metal layer 20 to cover the upper surface and the side surface of the protrusion 18a. Other structures are the same as those of the acoustic wave device 100.

Figure 11A:
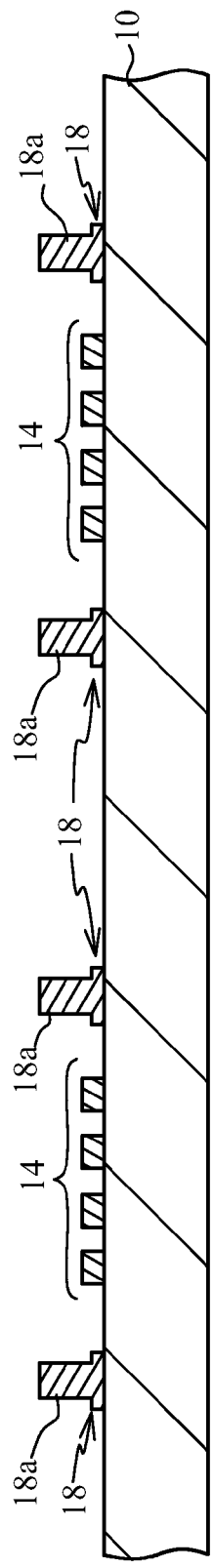
FIG. 11A and FIG. 11B are cross-sectional views illustrating a method of fabricating the acoustic wave device.
Figure 11B:
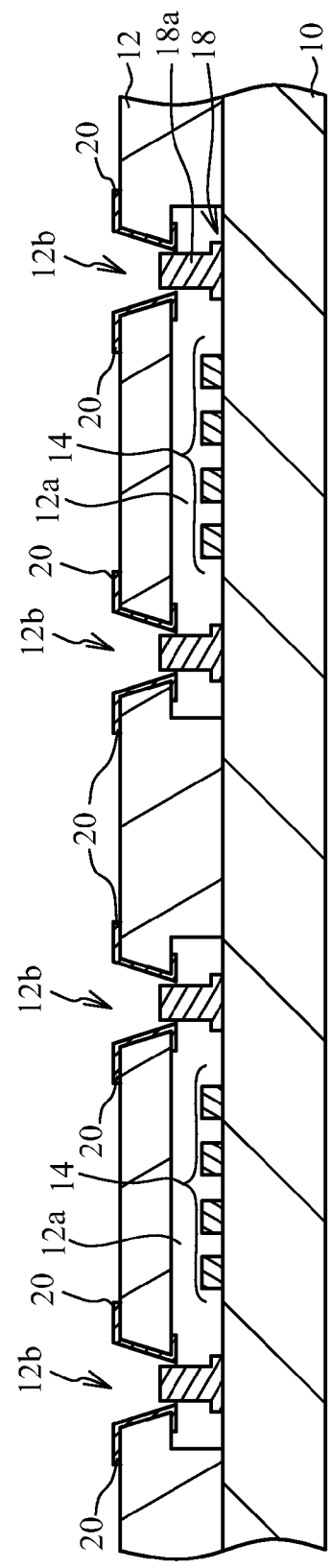

A description will now be given of a method of fabricating the acoustic wave device 200. FIG. 11A and FIG. 11B are cross-sectional views illustrating a method of fabricating the acoustic wave device 200. The IDTs 14 are formed on the upper surface of the substrate 10 (see FIG. 2B). As illustrated in FIG. 11A, the pads 18 are then formed on the upper surface of the substrate 10. The cap 12 is processed through the steps illustrated in FIG. 3A through FIG. 3D. As illustrated in FIG. 11B, the protrusions 18a are inserted into the penetration holes 12b to position the cap 12. The substrate 10 is bonded to the cap 12 by room-temperature bonding.

Figure 12A:
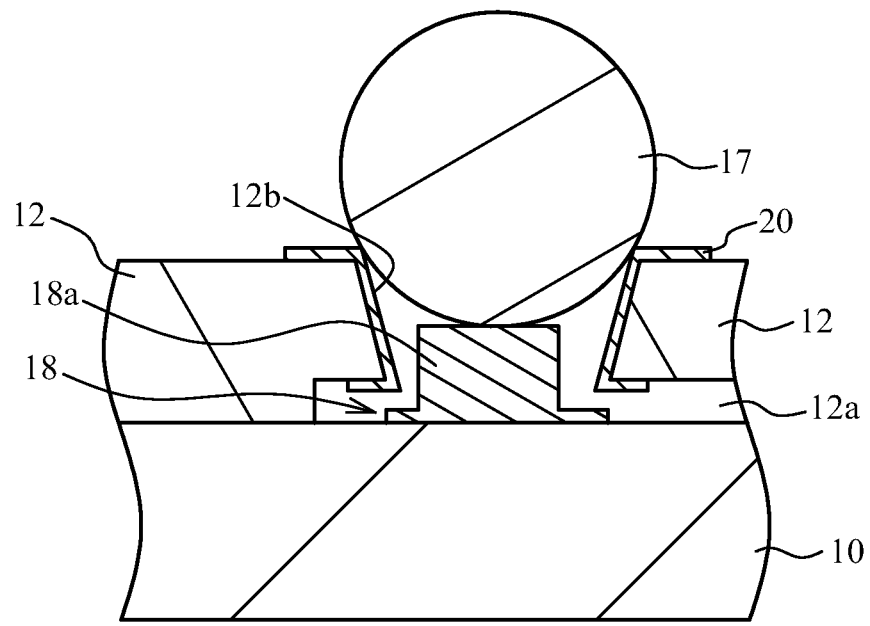
FIG. 12A and FIG. 12B are enlarged cross-sectional views around a penetration hole.
Figure 12B:
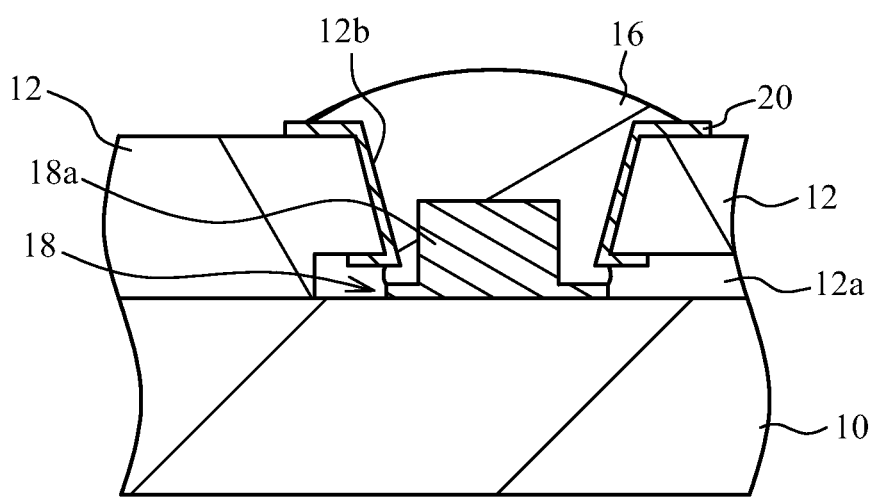

The formation of the terminal 16 is now described with reference to enlarged views. FIG. 12A and FIG. 12B are enlarged cross-sectional views around the penetration hole 12b. As illustrated in FIG. 12A, the solder ball 17 is located on the penetration hole 12b. As illustrated in FIG. 12B, the melted solder ball 17 wet-spreads to cover the upper surface and the side surface of the protrusion 18a. This forms the terminal 16. The subsequent steps are the same as those described in the first embodiment.

According to the second embodiment, the insertion of the protrusion 18a into the penetration hole 12b improves the accuracy in alignment between the substrate 10 and the cap 12. The solder wet-spreads from the upper surface to the side surface of the protrusion 18a. The area of contact with the solder becomes large, and thus the bond between the terminal 16 and the pad 18 is strengthened. In addition, the volume of the solder can be reduced, and thus the cost reduction becomes possible, and the solder is prevented from spreading to the IDT 14. The height of the protrusion 18a can be changed. The bond strength with the solder can be also enhanced by the protrusion 18a not reaching the inside of the penetration hole 12b. To achieve the high accuracy in alignment, however, the protrusion 18a is preferably located inside the penetration hole 12b. The first and second embodiments may be applied to a boundary acoustic wave device.

Third Embodiment

Figure 13A:
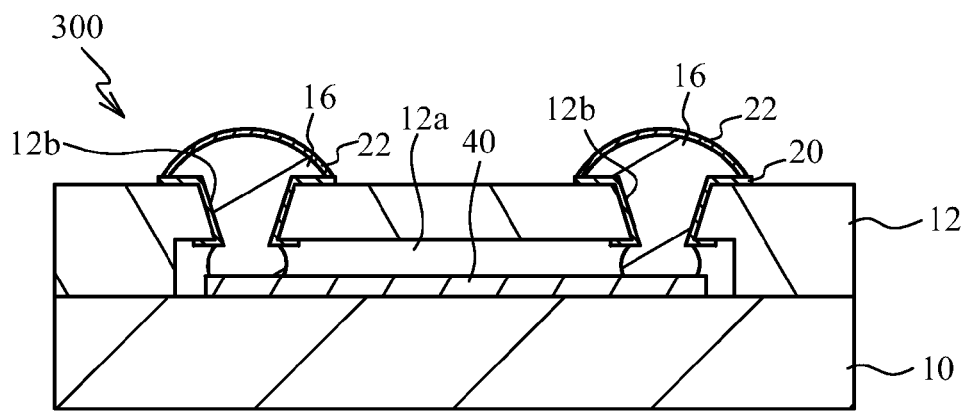
FIG. 13A is a cross-sectional view illustrating an acoustic wave device in accordance with a third embodiment.
Figure 13B:
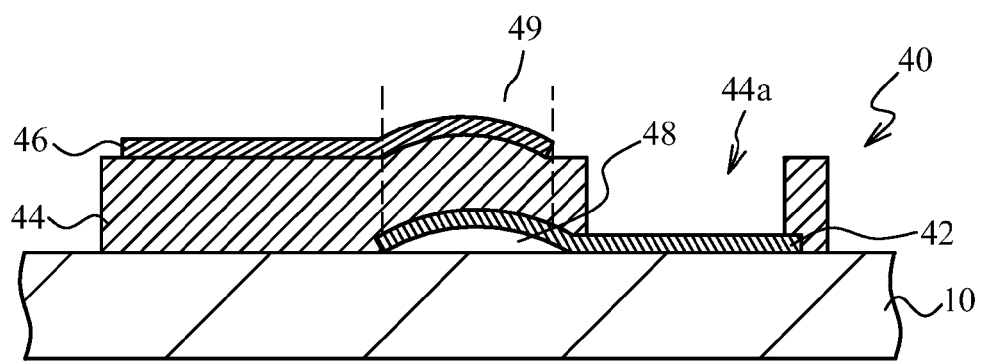
FIG. 13B is enlarged cross-sectional view of an FBAR.

A third embodiment is an exemplary acoustic wave device using an FBAR. FIG. 13A is a cross-sectional view illustrating an acoustic wave device 300 in accordance with the third embodiment. FIG. 13B is an enlarged cross-sectional view of an FBAR 40.

As illustrated in FIG. 13A, the FBAR 40 is sealed in the cavity 12a. As illustrated in FIG. 13B, the FBAR 40 includes a lower electrode 42, a piezoelectric thin film 44, and an upper electrode 46. The lower electrode 42 is stacked on the substrate 10, the piezoelectric thin film 44 is stacked on the lower electrode 42, and the upper electrode 46 is stacked on the piezoelectric thin film 44. A dome-shaped air-space 48 is formed between the lower electrode 42 and the upper surface of the substrate 10, and the lower electrode 42 is exposed to the air-space 48. A functional element exciting an acoustic wave is a resonance region 49 in which the lower electrode 42, the piezoelectric thin film 44, and the upper electrode 46 overlap with each other in the thickness direction. A part of the lower electrode 42 exposed from an aperture 44a of the piezoelectric thin film 44 functions as a terminal portion for extracting an electrical signal. The terminals 16 illustrated in FIG. 13A are coupled to a part of the lower electrode 42 exposed from the aperture 44a and the upper electrode 46.

The substrate 10 is formed of an inorganic insulating material such as silicon (Si). The cap 12 illustrated in FIG. 13A may be formed of Si as the substrate 10. When both the substrate 10 and the cap 12 are formed of Si, the substrate 10 has a thermal expansion coefficient close to that of the cap 12, and thus the stress due to temperature change is reduced. When the substrate 10 and the cap 12 have low electric resistances, electrical current flows from the terminal 16 to the substrate 10 and the cap 12, and the loss of signal increases. To suppress the electrical current, the substrate 10 and the cap 12 are preferably formed of Si having a high resistance such as 1 kΩ·cm or greater. The cap 12 may be formed of Si with a low resistance, and an insulating layer (not illustrated) may be located between the inner wall of the penetration hole 12b and the metal layer 20. This structure can suppress the electrical current flowing through the cap 12. The cap 12 may be formed of glass. The substrate 10 formed of Si can be bonded to the cap 12 formed of glass by anodic bonding.

The lower electrode 42 and the upper electrode 46 are formed of ruthenium (Ru) with a thickness of, for example, 250 nm. The piezoelectric thin film 44 is formed of a piezoelectric substance such as aluminum nitride (AlN) or zinc oxide (ZnO).

Fourth Embodiment

Figure 14:
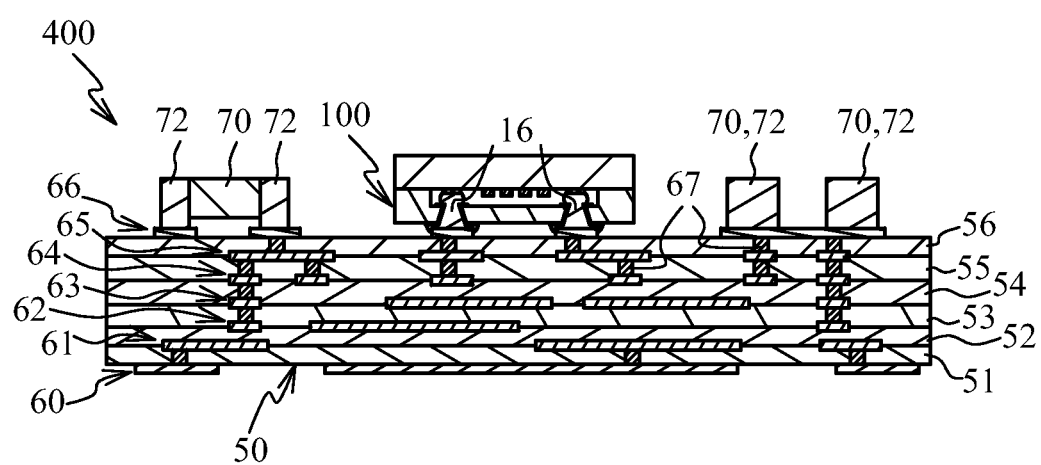
FIG. 14 is a cross-sectional view illustrating a module in accordance with a fourth embodiment.

A fourth embodiment is an exemplarly module including the acoustic wave device 100. FIG. 14 is a cross-sectional view illustrating a module 400 in accordance with the fourth embodiment. As illustrated in FIG. 14, the module 400 includes the acoustic wave device 100, a mounting substrate 50, and chip components 70.

The mounting substrate 50 is a multilayered substrate, and formed by alternately stacking insulating layers 51~56 and conductive layers 60~66. The conductive layers are electrically interconnected by via wirings 67 penetrating through the insulating layers. Reference numerals are affixed to a part of the via wirings 67.

The acoustic wave device 100 is mounted on the mounting substrate 50, and the terminals 16 are bonded to the pads included in the conductive layer 66. As illustrated in FIG. 1A, the terminal 16 protrudes from the upper surface of the cap 12, and thereby flip-chip mounting illustrated in FIG. 14 is easily performed. The chip components 70 are electrically connected to the pads of the conductive layer 66 by solder 72. The conductive layer 60 is used to connect the mounting substrate 50 to external devices.

Each of the chip components 70 is a passive element such as an inductor or a capacitor, and matches impedance between an unillustrated antenna and the acoustic wave device 100. The acoustic wave device 100 functions as a receive filter and a transmit filter. A plurality of the acoustic wave devices 100 may be mounted on the mounting substrate 50. The plurality of the acoustic wave devices 100 function as a duplexer. The insulating layers 51~56 are formed of a resin such as a glass epoxy resin or an insulating material such as ceramic. The conductive layers 61~66 and the via wirings 67 are formed of a metal such as Cu.

Fifth Embodiment

Figure 15:
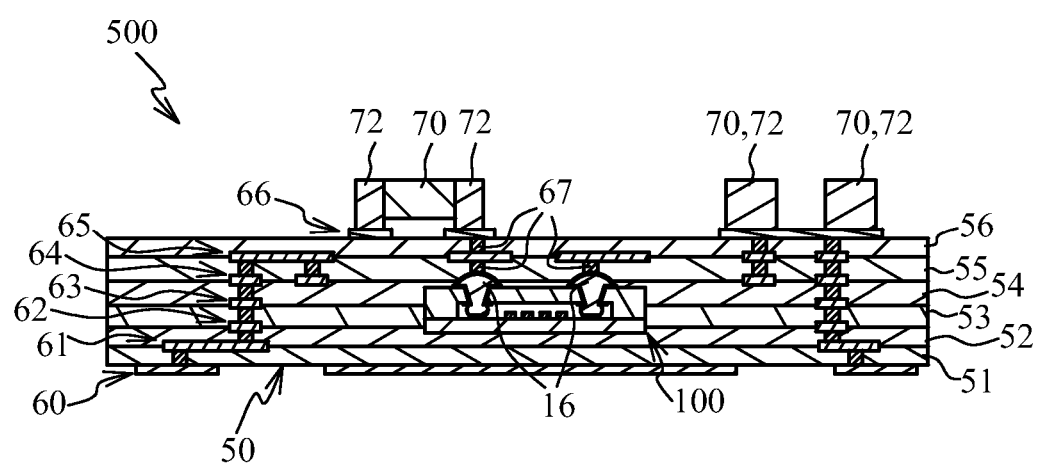
FIG. 15 is a cross-sectional view illustrating a module in accordance with a fifth embodiment.

A fifth embodiment is an alternative exemplary module. FIG. 15 is a cross-sectional view illustrating a module 500 in accordance with the fifth embodiment. As illustrated in FIG. 15, the acoustic wave device 100 is embedded in the inside of the mounting substrate 50. Thus, it becomes more difficult for moisture and foreign matters to penetrate into the acoustic wave device 100. The terminals 16 of the acoustic wave device 100 are coupled to the via wiring 67. As illustrated in FIG. 1A, the terminal 16 protrudes from the upper surface of the cap 12, and thus the terminal 16 can be easily connected to the via wiring 67 as illustrated in FIG. 15. In the fourth and fifth embodiments, the acoustic wave device 110, 200, or 300 may be mounted.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   a pad formed on the substrate;
   a cap formed of an inorganic insulating material, located on the substrate and bonded to the substrate, the cap including a penetration hole formed in a location overlapping with the pad, and defining a cavity between the substrate and the cap;
   a terminal filling the penetration hole, coupled to the pad on the substrate, formed of solder, and being surrounded by the cavity in a planar view; and
   a functional element formed on an upper surface of the substrate and in the cavity, the functional element exciting an acoustic wave.

2. The acoustic wave device according to claim 1, wherein the penetration hole has a tapered shape to taper from an upper surface of the cap toward the cavity.

3. The acoustic wave device according to claim 1, wherein the pad includes a protrusion protruding upward from the upper surface of the substrate, and the terminal is bonded to the protrusion.

4. The acoustic wave device according to claim 3, wherein the protrusion extends from the upper surface of the substrate to an inside of the penetration hole.

5. The acoustic wave device according to claim 1, wherein the terminal protrudes upward from an upper surface of the cap.

6. The acoustic wave device according to claim 1, further comprising:
   a metal layer continuously formed from an upper surface of the cap to a lower surface of the cap through an inner wall of the penetration hole, wherein
   the terminal is bonded to the metal layer.

7. The acoustic wave device according to claim 1, further comprising:
   a plated layer covering a surface of the terminal.

8. The acoustic wave device according to claim 1, wherein the substrate is a piezoelectric substrate, and the functional element is an IDT.

9. The acoustic wave device according to claim 8, wherein the cap is formed of a piezoelectric substance or sapphire.

10. The acoustic wave device according to claim 1, wherein
    the functional element is a region in which an upper electrode, a piezoelectric thin film, and a lower electrode of a piezoelectric thin film resonator overlap with each other.

11. The acoustic wave device according to claim 10, wherein
    the substrate is formed of silicon; and
    the cap is formed of silicon or glass.

12. The acoustic wave device according to claim 1, wherein
    the substrate and the cap are formed of a same material.

* * * * *